(12) United States Patent
Deng

(10) Patent No.: US 10,594,342 B1
(45) Date of Patent: Mar. 17, 2020

(54) POWER AMPLIFYING SYSTEM AND ASSOCIATED POWER AMPLIFYING METHOD FOR BLUETOOTH DEVICE

(71) Applicant: Realtek Semiconductor Corp., HsinChu (TW)

(72) Inventor: Ping-Yuan Deng, Taoyuan (TW)

(73) Assignee: Realtek Semiconductor Corp., HsinChu (TW)

(*) Notice: Subject to any disclaimer, the term of this patent is extended or adjusted under 35 U.S.C. 154(b) by 0 days.

(21) Appl. No.: 16/574,105

(22) Filed: Sep. 18, 2019

(30) Foreign Application Priority Data

Apr. 9, 2019  (TW) .............................. 108112312 A

(51) Int. Cl.
*H04B 1/04* (2006.01)
*H03F 3/24* (2006.01)

(52) U.S. Cl.
CPC ............... *H04B 1/04* (2013.01); *H03F 3/245* (2013.01); *H04B 2001/0416* (2013.01)

(58) Field of Classification Search
CPC .... H04B 1/04; H04B 2001/0416; H03F 3/245
See application file for complete search history.

(56) References Cited

U.S. PATENT DOCUMENTS

| | | | |
|---|---|---|---|
| 7,515,931 B2 | 4/2009 | Olip | |
| 7,894,778 B2 | 2/2011 | Li | |
| 8,121,214 B2 | 2/2012 | Tal | |
| 8,699,548 B2* | 4/2014 | Savoj | H03L 7/099 375/219 |
| 9,548,774 B2 | 1/2017 | Lin | |
| 2008/0311860 A1* | 12/2008 | Tanaka | H04B 1/28 455/73 |
| 2011/0140746 A1 | 6/2011 | Park | |

OTHER PUBLICATIONS

Hooman Darabi, Janice Chiu, Shahla Khorram, Hea Joung Kim, Zhimin Zhou, Hung-Ming (ED) Chien, Brima Ibrahim, E. Geronaga, Long H. Tran, and Ahmadreza Rofougaran, "A Dual-Mode 802.11b/Bluetooth Radio in 0.35 μm CMOS", Mar. 2005, IEEE, USA.
Andrea Bevilacqua, Pietro Andreani, "A 2.7-6.1 GHz CMOS Local Oscillator Based on Frequency Multiplication by 3/2", 2011, IEEE, USA.

* cited by examiner

*Primary Examiner* — Nguyen T Vo
(74) *Attorney, Agent, or Firm* — Winston Hsu

(57) ABSTRACT

A power amplifying system includes a voltage control oscillator (VCO), a frequency divider, a mixer and an adding amplifier. The VCO is configured to provide an input signal having a frequency that is a non-integer multiple of a predetermined frequency. The frequency divider is coupled to the VCO, and configured to receive the input signal and perform frequency division upon the input signal to respectively generate an in-phase signal and a quadrature signal corresponding to the input signal. The mixer is coupled to the VCO and the frequency divider, and configured to mix the input signal transmitted from the VCO and the in-phase signal transmitted from the frequency divider to output a mixed signal. The adding amplifier is coupled to the mixer and the frequency divider, and configured to integrate the mixed signal and the quadrature signal to generate an output signal having the predetermined frequency.

20 Claims, 8 Drawing Sheets

US 10,594,342 B1

POWER AMPLIFYING SYSTEM AND ASSOCIATED POWER AMPLIFYING METHOD FOR BLUETOOTH DEVICE

BACKGROUND OF THE INVENTION

1. Field of the Invention

The present invention is related to power amplifiers applications, and more particularly, to power modification of Bluetooth transmission.

2. Description of the Prior Art

In a conventional direct-up transmitter, if a frequency of a voltage control oscillator (VCO) is selected to have a same frequency as the even harmonics of a power amplifier (PA), the frequency of the VCO might be affected by the frequency of the PA. This is referred to as PA-pulling. An Error Vector Magnitude (EVM) thereof may degrade, further worsening communications quality. Taking a 2.4 GHz Bluetooth transmitter as an example, when the frequency of a signal of the VCO is 2.4 GHz or a multiple thereof (e.g. 4.8 GHz, 9.6 GHz), the aforementioned PA-pulling may be generated.

The following describes various related art methods of solving the above problems.

Refer to FIG. 1, which is a diagram illustrating a Bluetooth transmitter as disclosed in "H. Darabi, et al., "*A Dual-Mode 802.11b/Bluetooth Radio in 0.35 um CMOS,*" *IEEE J. Solid State Circuits*, pp. 698-706. March 2005." For the purpose of preventing the PA-pulling, a frequency of the VCO shown in FIG. 1 may be selected to be two thirds of the LO frequency (2.4 GHz), i.e. 1.6 GHz, where a mixer utilizes a double sideband mixer (DSB) architecture. A disadvantage of this art is that there are additional non-ideal spurs at 800 MHz on an output terminal of this mixer in addition to the 2.4 GHz signal, greatly affecting features of the PA.

Refer to FIG. 2, which is a diagram illustrating a fractional frequency multiplier as disclosed in "A. Bevilacqua "*A 2.7-6.1 GHz CMOS Local Oscillator Based on Frequency Multiplication by 3/2,*" 2011 *NORCHIP*"), where when the VCO selects a signal which is two thirds of the 2.4 GHz signal to prevent generating PA-pulling, a final output of the mixer needs to undergo a 3/2 recovery to obtain the 2.4 GHz signal. For this purpose, a frequency divider is utilized to divide a frequency of a VCO by two, and then generate a three times result via frequency multiplication, thereby obtaining a 1.5 times output frequency of the VCO. The aforementioned method requires an odd number multiplication architecture, which has a complicated design that may greatly increase costs. Thus, the method of directly recovering by multiples upon an output terminal is not ideal.

US Patent Application No. 20110140746 A1 discloses taking a single sideband (SSB) mixer as the mixer. Although this art can further suppress non-ideal spurs, the disadvantage is that both input terminals of the mixer need in-phase/quadrature (I/Q) signals.

Refer to FIG. 3, which illustrates U.S. Pat. No. 7,894,778, which is a multiband LO generator that can modify a frequency to be 1.5 times or 1.25 times, thereby reducing a frequency modifying range of a VCO. A disadvantage of the aforementioned method is that the non-ideal spurs may become closer to the desired output frequency along with the level of fractional numbers.

In addition, U.S. Pat. No. 9,548,774 discloses an N-path filter architecture configured to generate a band reject frequency response via an N-path filter, and an output terminal which utilizes a double sideband (DSB) to filter out the non-ideal spurs. A disadvantage thereof is that a clock for the N-path filter is required. If N=4, a clock having a 25% duty cycle needs to be generated, where an order number needs to be increased in order to have good filtering effect. Expansion of the order number is difficult: the greater the order number, the less the duty cycle for operations. This therefore consumes more power.

In addition, U.S. Pat. Nos. 7,515,931 and 8,121,214 propose utilizing a band-pass filter (BPF) to filter out the non-ideal spurs. Although the BPF is relatively simple, it may occupy a greater area, thereby increasing costs.

As detailed above, the related arts cannot solve the problem of PA-pulling without introducing any side effects. Thus, there is a need for a novel method and associated circuit to solve the aforementioned problem.

SUMMARY OF THE INVENTION

An objective of the present invention is to provide a power amplifying (PA) system for a Bluetooth device, and an associated method, to solve the bottle neck encountered in the related art without introducing any side effect.

At least one embodiment of the present invention provides a power amplifying system for a Bluetooth device. The power amplifying system is configured to generate an output having a predetermined frequency. The power amplifying system comprises a voltage control oscillator (VCO), a frequency divider, a mixer and an adding amplifier. The VCO is configured to provide an input signal having a frequency that is a non-integer multiple of the predetermined frequency. The frequency divider is coupled to the VCO, and is configured to receive the input signal and perform frequency division upon the input signal to respectively generate an in-phase signal and a quadrature signal corresponding to the input signal. The mixer is respectively coupled to the VCO and the frequency divider, and is configured to mix the input signal transmitted from the VCO and the in-phase signal transmitted from the frequency divider to output a mixed signal. The adding amplifier is respectively coupled to the mixer and the frequency divider, and is configured to integrate the mixed signal and the quadrature signal to generate a first output signal having a frequency that is an integer multiple of the predetermined frequency.

At least one embodiment of the present invention provides a power amplifying method for a Bluetooth device. The power amplifying method is configured to generate an output having a predetermined frequency. The power amplifying method comprises: providing an input signal having a frequency that is a non-integer multiple of the predetermined frequency via a voltage control oscillator (VCO); performing frequency division upon the input signal to respectively generate an in-phase signal and a quadrature signal corresponding to the input signal via a frequency divider; mixing the input signal transmitted from the voltage control oscillator (VCO) and the in-phase signal transmitted from the frequency divider to output a mixed signal via a mixer; and integrating the mixed signal and the quadrature signal to generate a first output signal having a frequency that is an integer multiple of the predetermined frequency via an adder amplifier.

Briefly summarized, the present invention generates an invert spur signal to neutralize spurs via feed forward. In this way, non-ideal spurs of a mixer can be eliminated without in-phase/quadrature (I/O) for the mixer and/or installing high order filters or inductors for an output terminal. Thus, the present invention can implement required PA effects and eliminate the non-ideal spurs with less cost as compared to the related arts.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention proposes a simple design, which mainly utilizes a feed forward technique to generate an inverter spur signal to eliminate non-ideal spurs. The non-ideal spurs of a mixer can be eliminated without in-phase/quadrature (I/O) for the mixer and/or installing high order filters or inductors for an output terminal. In comparison with a feedback technique, the feed forward technique of the present invention may be roughly comprehended as: predicting and responding prior to interference affecting the system.

Figure 1:
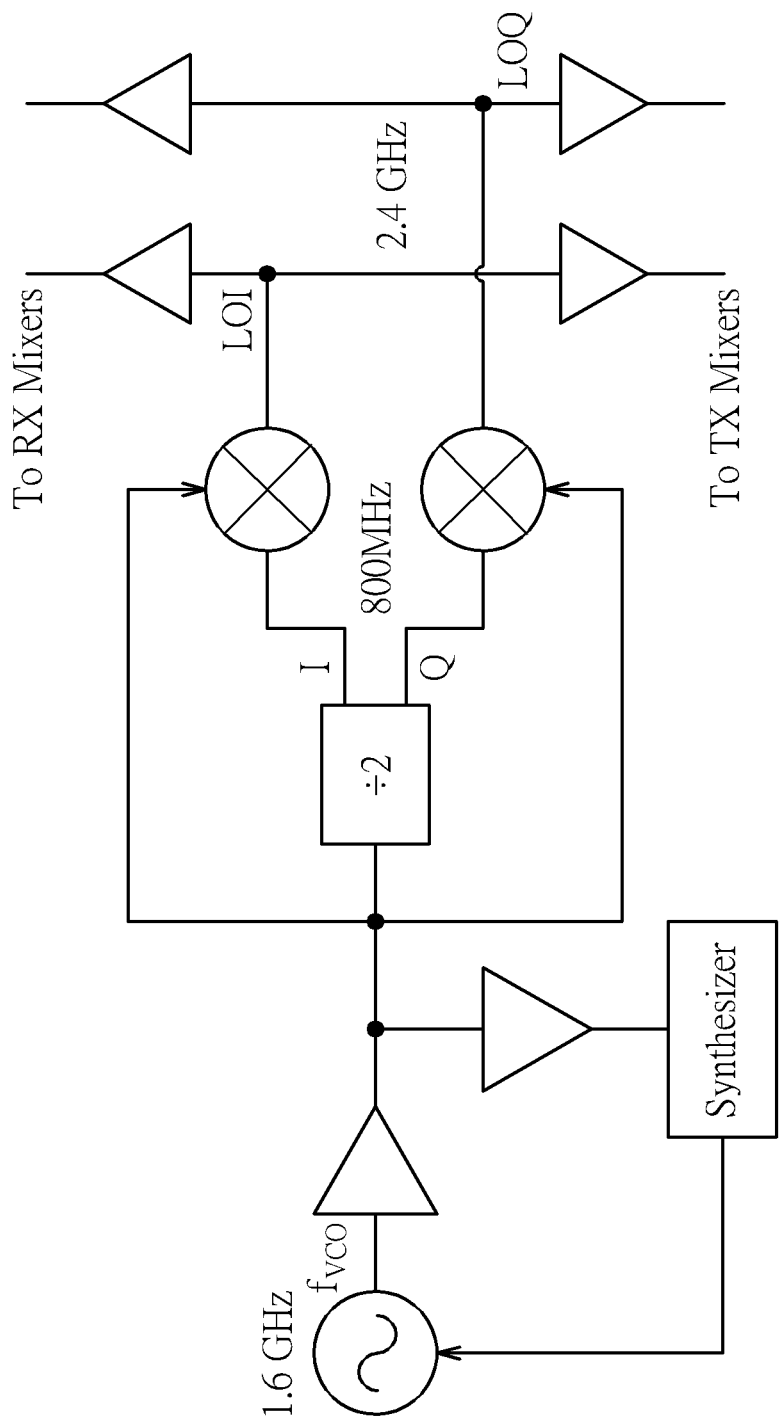
FIGS. 1-3 are diagrams illustrating filters designed regarding harmonic interference according to the related arts.
Figure 2:
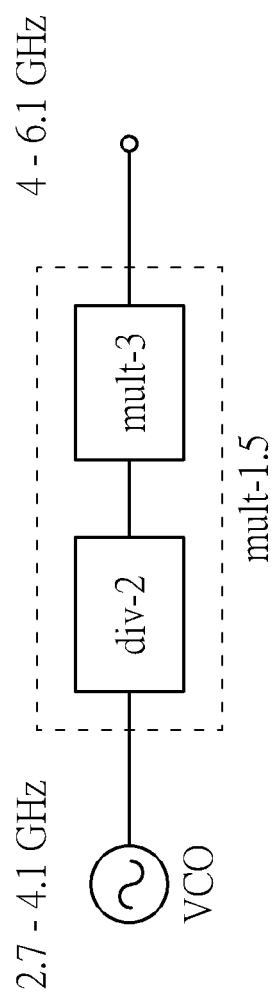
Figure 3:
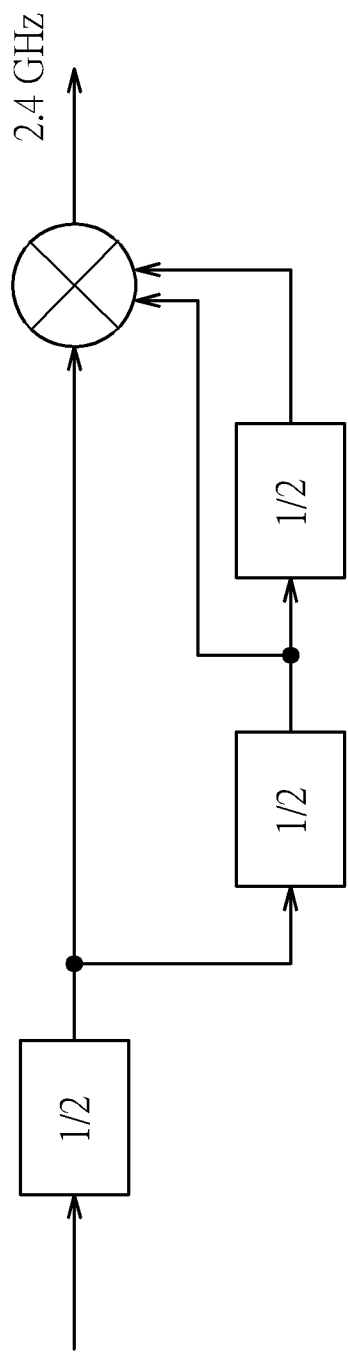
Figure 4:
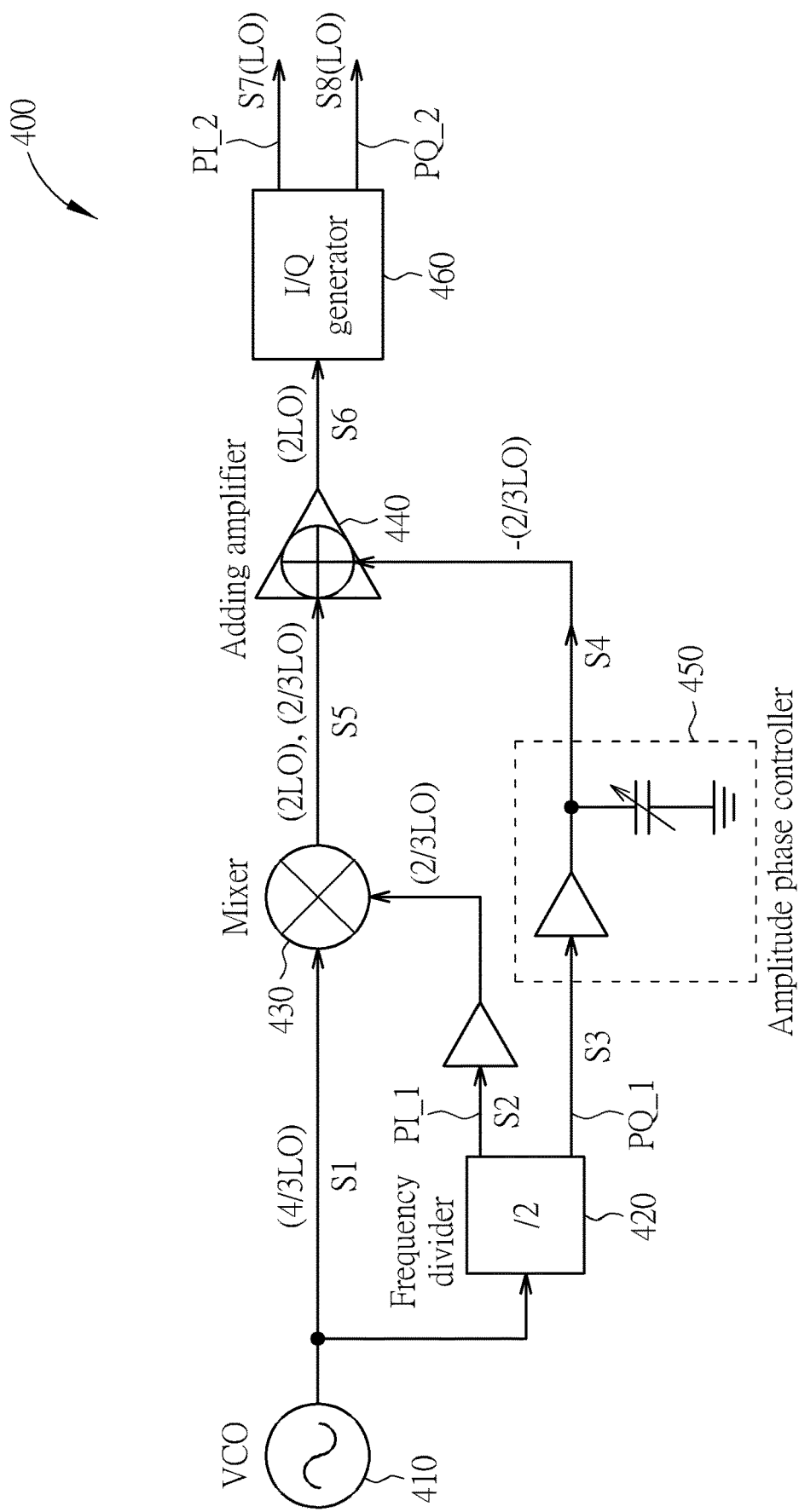
FIG. 4 is a diagram illustrating a power amplifying system for a Bluetooth device according to an embodiment of the present invention.

Refer to FIG. 4, which is a diagram illustrating a power amplifier (PA) system 400 for a Bluetooth device according to an embodiment of the present invention. For the purpose of solving the problems of the related art, the present invention may configure a frequency of a voltage control oscillator (VCO) to be a non-integer multiple of the PA harmonic frequency at the beginning, e.g. the frequency of the VCO and that of the frequency of the VCO divided by two may be transmitted to a mixer to generate a required local oscillator (LO) frequency. The power amplifying system 400 is configured to generate an output having a predetermined frequency (LO), where the predetermined frequency may be twice the LO frequency (2LO) for example, but the present invention is not limited thereto. The power amplifying system 400 may comprise a VCO 410, a frequency divider 420, a mixer 430, an adding amplifier 440, an amplitude phase controller 450 and an in-phase/quadrature (I/Q) generator 460. The VCO is configured to provide an input signal having a frequency that is a non-integer multiple of the predetermined frequency (i.e. a signal having a frequency that is not an integer multiple of the LO frequency). In this embodiment, the VCO 410 is configured to provide an input signal S1 having a frequency that is four thirds of the LO frequency (referred to as "4/3LO frequency" for brevity).

The frequency divider 420 is coupled to the VCO 410, and is configured to receive the input signal having the 4/3LO frequency, and the frequency divider 420 may perform frequency division upon the input signal S1 to respectively generate an in-phase signal S2 and a quadrature signal S3 corresponding to the input signal S1. The frequency divider 420 may be a dividing-two circuit (labeled "/2" in figures), and a phase difference between the in-phase signal S2 and the quadrature signal S3 is 90 degrees, but the present invention is not limited thereto. For example, the frequency divider 420 may be replaced with a dividing-four circuit.

The mixer 430 is respectively coupled to the VCO 410 and the frequency divider 420, and is configured to mix the input signal S1 (having the 4/3LO frequency) transmitted from the VCO 410 and the in-phase signal S2 (having a frequency that is two-thirds of the LO frequency, herein referred to as "2/3LO frequency") transmitted from the frequency divider 420 to output a mixed signal S5, where the mixed signal S5 has a frequency that is twice the LO frequency (herein referred to as "2LO frequency") and has a non-ideal spur at the 2/3LO frequency (labeled "(2LO), (2/3LO)" in the figures) which is hard to avoid. The mixer 430 may be implemented by a double sideband (DSB) mixer, but the present invention is not limited thereto. The DSB mixer is a well-known architecture in the art, and related details are omitted for brevity.

The amplitude phase controller 450 is coupled between the adding amplifier 440 and the frequency divider 420, and is configured to receive the quadrature signal S3 transmitted from the frequency divider 420 and accordingly generate a modified quadrature signal S4 having the 2/3LO frequency (labeled "−(2/3LO)"). In some embodiments, the amplitude phase controller 440 may be a delay-locked loop, but the present invention is not limited thereto. Since the phase difference between the quadrature signal S3 and the in-phase signal S2 is 90 degrees, the modified quadrature signal S4 can generate an inverted spur signal having a same frequency and an opposite phase via proper modification of the amplitude phase controller 450, in order to neutralize spur components within the mixed signal S5. In addition, the quadrature signal S3 provides a 90-degree phase delay, a path between the amplitude phase controller 450 and the adding amplifier 440 provides a certain delay on phase (e.g. a 45-degree phase delay), and a final phase delay of the modified quadrature signal S4 may reach 180 degrees via properly modifying the amplitude phase controller 450 (e.g. generate a 45-degree phase delay).

Figure 5:
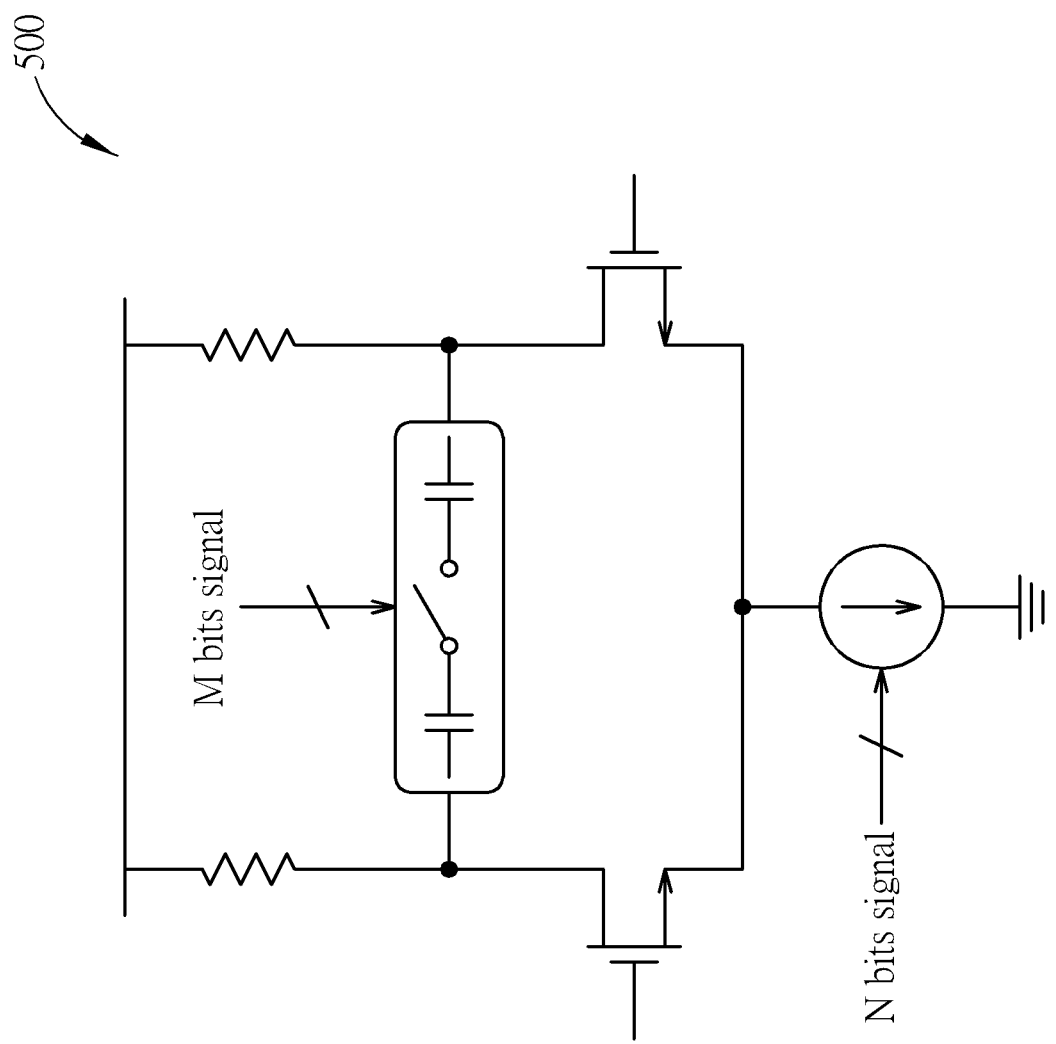
FIG. 5 is a diagram illustrating an amplitude phase controller of the power amplifying system shown in FIG. 4 according to an embodiment of the present invention.

FIG. 5 is a diagram illustrating the amplitude phase controller 450 of the power amplifying system 400 shown in FIG. 4 according to an embodiment of the present invention.

As shown in FIG. 5, a basic architecture of an amplitude and phase controller of the present invention is illustrated. An N bits signal controls a gain of a differential amplifier to modify an amplitude of a signal, and an M bits signal controls a low-pass filter capacitor on output terminals of the differential amplifier to modify a phase of the signal, where N and M may be positive integers. Generally, the amplitude phase controller 450 may be implemented by a one-order low-pass filter, and a higher order low-pass filter may be used if parasitic capacitor (s) generated by the circuit are not enough to generate a required delay, e.g. a two-order low-pass filter.

Figure 6:
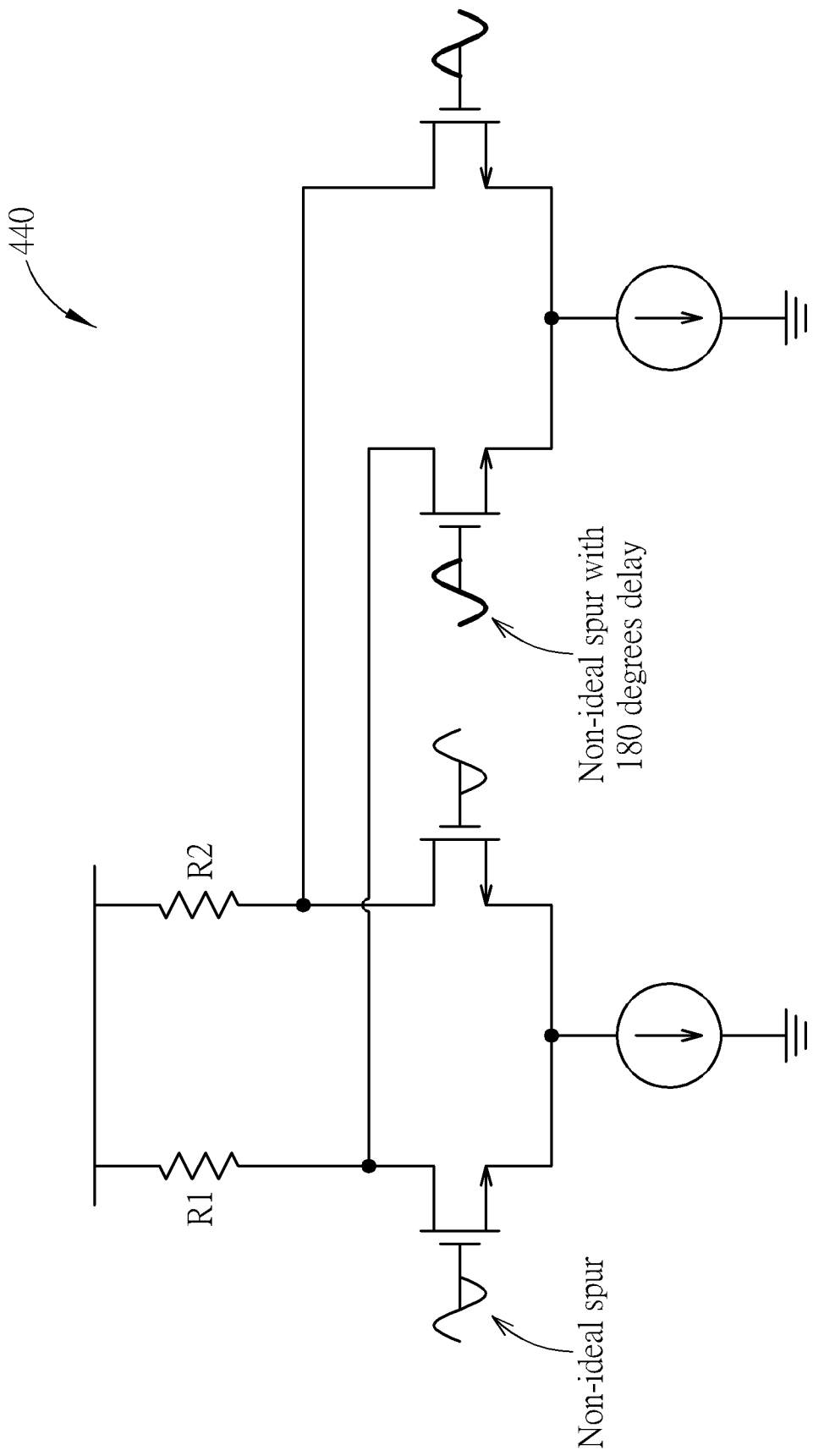
FIG. 6 is a diagram illustrating an adding amplifier shown in FIG. 4 according to an embodiment of the present invention.

The adding amplifier 440 is respectively coupled to the mixer 430 and the amplitude phase controller 450, and is configured to integrate the mixed signal S5 and the modified quadrature signal S4 to generate an output signal having a frequency that is an integer multiple of the predetermined frequency (2LO). The adding amplifier 440 may be implemented by an architecture shown in FIG. 6, where FIG. 6 is a diagram illustrating the adding amplifier 440 shown in FIG. 4 according to an embodiment of the present invention. The adding amplifier 440 is implemented by a differential amplifier, which adds the non-ideal spur outputted by the mixer 430 and an inverter waveform (i.e. the modified quadrature signal S4 having 180 degrees phase difference) to thereby neutralize them, which can achieve the effect of suppressing non-ideal spurs and amplifying desired signals. As shown in FIG. 6, utilizing resistors R1 and R2 to be loads of the adding amplifier 440 can save on overall area, and resistors in FIG. 6 may be replaced with inductors for the purpose of further improving the effect of suppressing spurs.

The I/Q generator 460 is coupled to output terminal(s) of the adding amplifier 440, and is configured to process an output signal (2LO) of the adding amplifier 440 to generate at least one output signal having the predetermined frequency (LO). Output signals S7 and S8 may be obtained from outputs of an in-phase path PI 2 and a quadrature path PQ 2, respectively. Since the purpose of the I/Q generator 460 is only for reducing the frequency of the output signal of the adding amplifier by one multiple, configuration of the I/Q generator 460 may be omitted under some situations.

Figure 7:
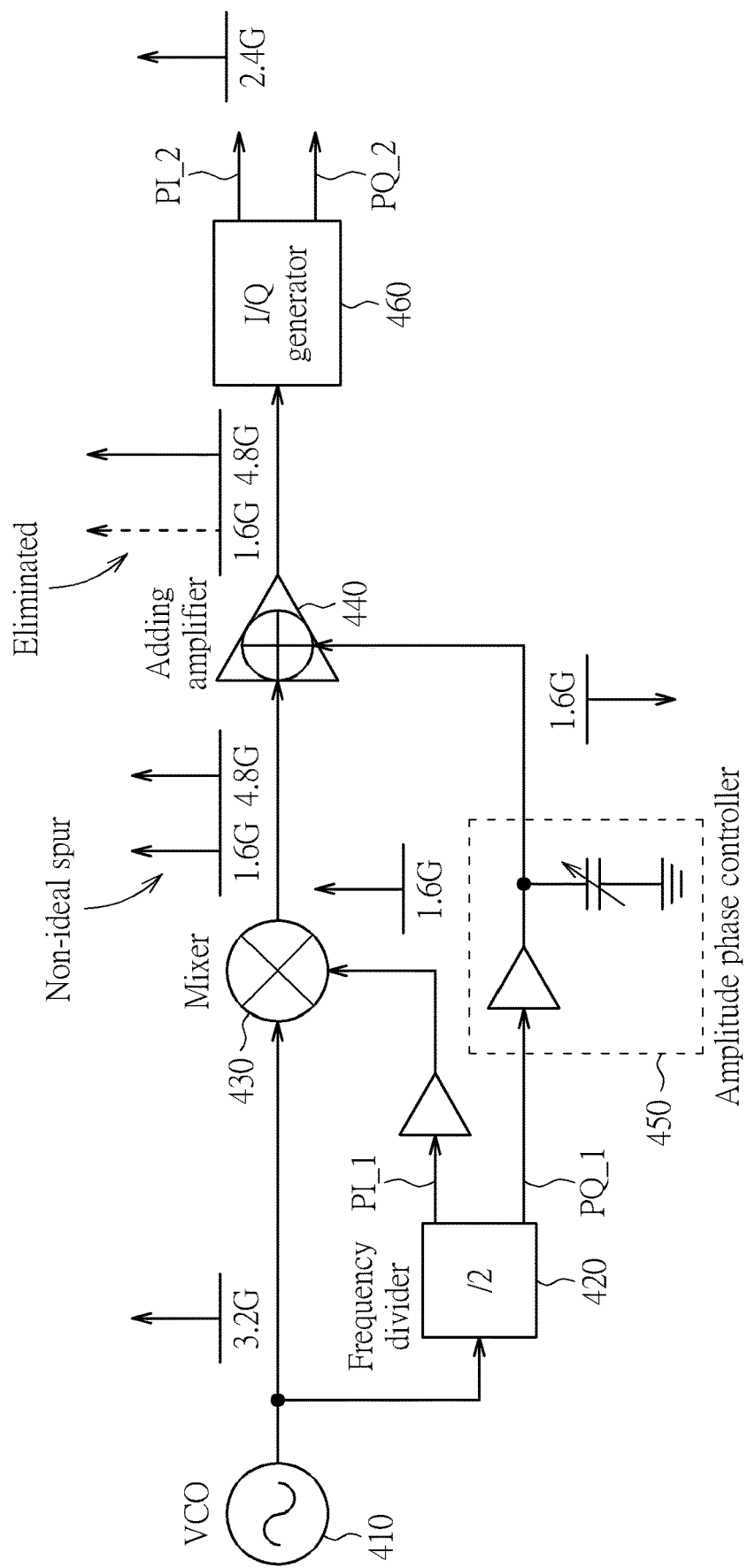
FIG. 7 is a diagram illustrating the power amplifying system shown in FIG. 4 applied to 2.4 GHz Bluetooth transmission according to an embodiment of the present invention.

For better comprehension, the following will describe the present invention by taking practical examples. Refer to FIG. 7, which is a diagram illustrating the power amplifying system 400 shown in FIG. 4 applied to a 2.4 GHz Bluetooth transmission according to an embodiment of the present invention. As previously mentioned, if the signal of the VCO has a frequency that is an integer multiple of 2.4 GHz (e.g. 2.4 GHz, 4.8 GHz, 9.6 GHz), the PA-pulling problem will occur. Thus, in the power amplifying system 400 shown in FIG. 7, when an LO signal of a target is 2.4 GHz, the VCO 410 may provide a 3.2 GHz input to prevent the aforementioned problem, but the present invention is not limited thereto. The mixer 430 may receive and mix the 3.2 GHz signal from the VCO 410 and a 1.6 GHz signal (which has been divided by two) transmitted from an in-phase path PI 1. After mixing them, the mixer 430 may generate a 4.8 GHz signal and a 1.6 GHz signal (i.e. a non-ideal spur which has to be suppressed or filtered out before generating the LO signal). In addition, the amplitude phase controller 450 may generate an inverted 1.6 GHz spur signal having the same amplitude with 180 degrees phase delay according to the 1.6 GHz signal (which has been divided by two) transmitted from a quadrature path PQ 1. Since the frequency divider 420 utilizing a dividing-two circuit may directly obtain a phase with 90 degrees delay, a phase modifying range of the amplitude phase controller 450 can be reduced, thereby reducing an order number of phase modification. Finally, after the adding amplifier adds them up, since the non-ideal spur has been neutralized, a clean 4.8 GHz signal can be obtained, and after being processed by the I/Q generator 460, the required 2.4 GHz signal can be obtained.

Figure 8:
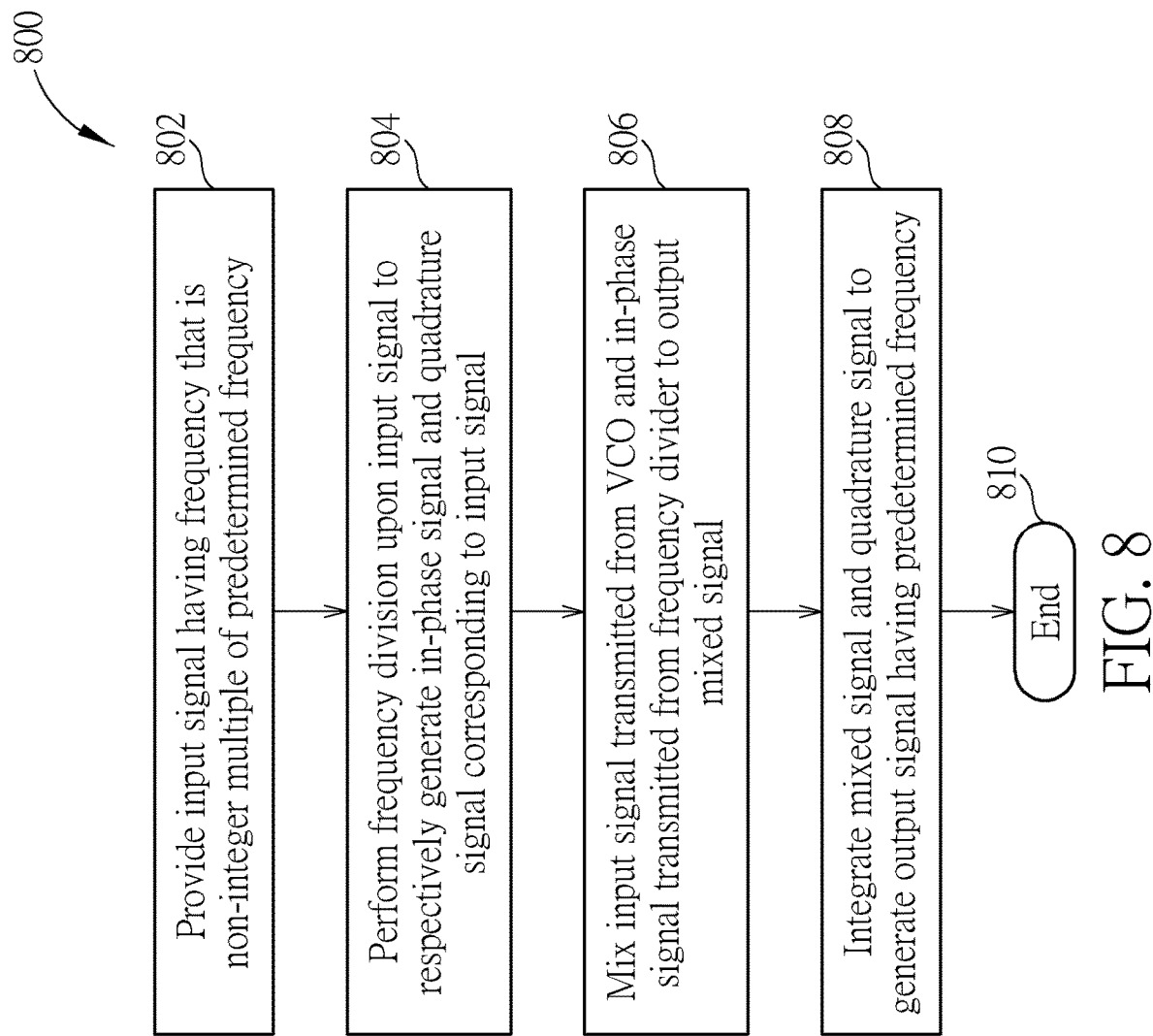
FIG. 8 is a flowchart illustrating a power amplifying method for a Bluetooth device according to an embodiment of the present invention.

FIG. 8 is a flowchart illustrating a power amplifying method 800 for a Bluetooth device according to an embodiment of the present invention. Note that these steps do not have to be executed by the order shown in FIG. 8 if the result is substantially the same. The method 800 shown in FIG. 8 may be adopted by the power amplifying system, and may be briefly summarized as follows:

Step 802: provide an input signal having a frequency that is a non-integer multiple of a predetermined frequency via a VCO;

Step 804: perform frequency division upon the input signal to respectively generate an in-phase signal and a quadrature signal corresponding to the input signal via a frequency divider;

Step 806: mix the input signal transmitted from the VCO and the in-phase signal transmitted from the frequency divider to output a mixed signal via a mixer;

Step 808: integrate the mixed signal and the quadrature signal to generate an output signal having the predetermined frequency via an adder amplifier;

Step 810: end.

Since those skilled in the art should understand details of each step shown in FIG. 8 after reading the above paragraphs, further description is omitted for brevity.

To summarize, the present invention can generate an inverted spur signal via a feed forward method to eliminate spurs, thereby solving the problem of the related art, e.g. spurs within output signals can be eliminated without greatly increasing costs (without utilizing high order filters or band-pass filters). In addition, it is emphasized that the present invention is applicable to a Bluetooth system, but the present invention is not limited thereto. For example, under the same/similar concept, the power amplifying system and the power amplifying method of the present invention may also be applied to Wireless Fidelity (Wi-Fi) architecture such as Wi-Fi 2.4G/5G architecture, to solve the problem of PA-pulling therein and thereby improving communications quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power amplifying system for a Bluetooth device, the power amplifying system being configured to generate an output having a predetermined frequency, the power amplifying system comprising:

a voltage control oscillator (VCO), configured to provide an input signal having a frequency that is a non-integer multiple of the predetermined frequency;

a frequency divider, coupled to the VCO, configured to receive the input signal and perform frequency division upon the input signal to respectively generate an in-phase signal and a quadrature signal corresponding to the input signal;

a mixer, respectively coupled to the VCO and the frequency divider, configured to mix the input signal transmitted from the VCO and the in-phase signal transmitted from the frequency divider to output a mixed signal; and an adding amplifier, respectively coupled to the mixer and the frequency divider, configured to integrate the mixed signal and the quadrature signal to generate a first output signal having a frequency that is an integer multiple of the predetermined frequency.

2. The power amplifying system of claim 1, further comprising:
an in-phase/Quadrature (I/Q) generator, coupled to an output terminal of the adding amplifier, configured to process the first output signal to generate at least one second output signal having the predetermined frequency.

3. The power amplifying system of claim 1, wherein the frequency divider is a dividing-two circuit, and a phase difference between the in-phase signal and the quadrature signal is 90 degrees.

4. The power amplifying system of claim 1, further comprising an amplitude phase controller, coupled between the adding amplifier and the frequency divider, configured to receive the quadrature signal and accordingly generate a modified quadrature signal.

5. The power amplifying system of claim 4, wherein the amplitude phase controller comprises:
an amplitude control unit, configured to modify an amplitude of the quadrature signal according to a signal magnification rate of the mixer; and
a phase control unit, configured to modify a phase of the quadrature signal.

6. The power amplifying system of claim 5, wherein the phase control unit modifies the phase of the quadrature signal according to the phase of the quadrature signal and a path delay between the adding amplifier and the amplitude phase controller, to generate the modified quadrature signal.

7. The power amplifying system of claim 4, wherein the modified quadrature signal is an inverted spur signal configured to neutralize a spur signal generated by the mixer.

8. The power amplifying system of claim 7, wherein a phase difference between the modified quadrature signal and the spur signal generated by the mixer is 180 degrees.

9. The power amplifying system of claim 4, wherein the amplitude phase controller is a delay-locked loop (DLL).

10. The power amplifying system of claim 1, wherein the VCO provides the input signal having a frequency that is four thirds of the predetermined frequency.

11. The power amplifying system of claim 1, wherein the mixer is a double sideband mixer (DSB) mixer.

12. A power amplifying method for a Bluetooth device, the power amplifying method being configured to generate an output having a predetermined frequency, the power amplifying method comprising:

providing an input signal having a frequency that is a non-integer multiple of the predetermined frequency via a voltage control oscillator (VCO);
performing frequency division upon the input signal to respectively generate an in-phase signal and a quadrature signal corresponding to the input signal via a frequency divider;
mixing the input signal transmitted from the VCO and the in-phase signal transmitted from the frequency divider to output a mixed signal via a mixer; and
integrating the mixed signal and the quadrature signal to generate a first output signal having a frequency that is an integer multiple of the predetermined frequency via an adder amplifier.

13. The power amplifying method of claim 12, further comprising:
processing the first output signal to generate at least one second output signal having the predetermined frequency.

14. The power amplifying method of claim 12, wherein the operation of performing frequency division upon the input signal is dividing the frequency of the input signal by two, and a phase difference between the in-phase signal and the quadrature signal is 90 degrees.

15. The power amplifying method of claim 12, further comprising:
generating a modified quadrature signal according to the quadrature signal.

16. The power amplifying method of claim 15, wherein the step of generating the modified quadrature signal comprises:
modifying an amplitude of the quadrature signal according to a signal magnification rate of the mixer; and
modifying a phase of the quadrature signal according to the phase of the quadrature signal and a path delay between an adding amplifier and an amplitude phase controller.

17. The power amplifying method of claim 15, wherein the modified quadrature signal is an inverted spur signal configured to neutralize a spur signal generated by the mixer.

18. The power amplifying method of claim 17, wherein a phase difference between the modified quadrature signal and the spur signal generated by the mixer is 180 degrees.

19. The power amplifying method of claim 12, wherein the VCO provides the input signal having a frequency that is four thirds of the predetermined frequency.

20. The power amplifying method of claim 12, wherein the mixer is a double sideband mixer (DSB) mixer.

* * * * *